(12) United States Patent
Taniguchi

(10) Patent No.: US 8,581,245 B2
(45) Date of Patent: Nov. 12, 2013

(54) THIN FILM TRANSISTOR, METHOD OF MANUFACTURING THIN FILM TRANSISTOR, DISPLAY UNIT, AND ELECTRONIC DEVICE

(75) Inventor: Satoshi Taniguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 238 days.

(21) Appl. No.: 13/006,736

(22) Filed: Jan. 14, 2011

(65) Prior Publication Data

US 2011/0180793 A1    Jul. 28, 2011

(30) Foreign Application Priority Data

Jan. 26, 2010 (JP) ................................ 2010-014339

(51) Int. Cl.
*H01L 29/12* (2006.01)
(52) U.S. Cl.
USPC 257/43; 257/59; 257/E29.068; 257/E33.053; 257/E21.409

(58) Field of Classification Search
USPC ........ 257/43, 59, E29.068, E33.053, E21.409
See application file for complete search history.

(56) References Cited

U.S. PATENT DOCUMENTS

2011/0212571 A1* 9/2011 Yamazaki et al. ............ 438/104

FOREIGN PATENT DOCUMENTS

JP    2007-281409    10/2007

* cited by examiner

*Primary Examiner* — Long Pham
(74) *Attorney, Agent, or Firm* — Dentons US LLP

(57) ABSTRACT

There is provided a thin film transistor including: a gate electrode; a pair of source/drain electrodes; a first oxide semiconductor layer provided between the gate electrode, and the pair of source/drain electrodes, and forming a channel; and a second oxide semiconductor layer provided on the pair of source/drain electrodes side of the first oxide semiconductor layer, and having a polarity different from that of the first oxide semiconductor layer.

6 Claims, 17 Drawing Sheets

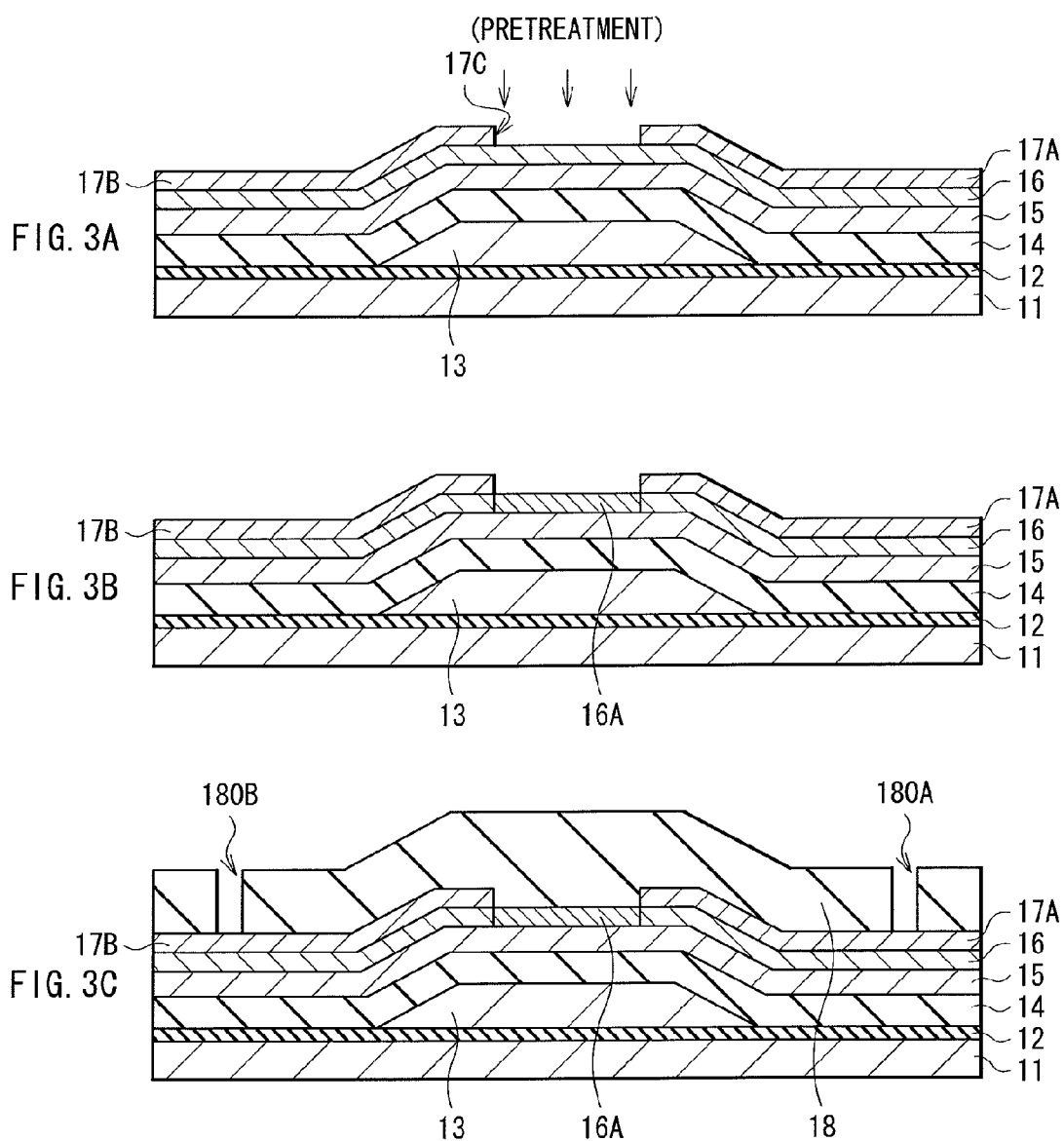

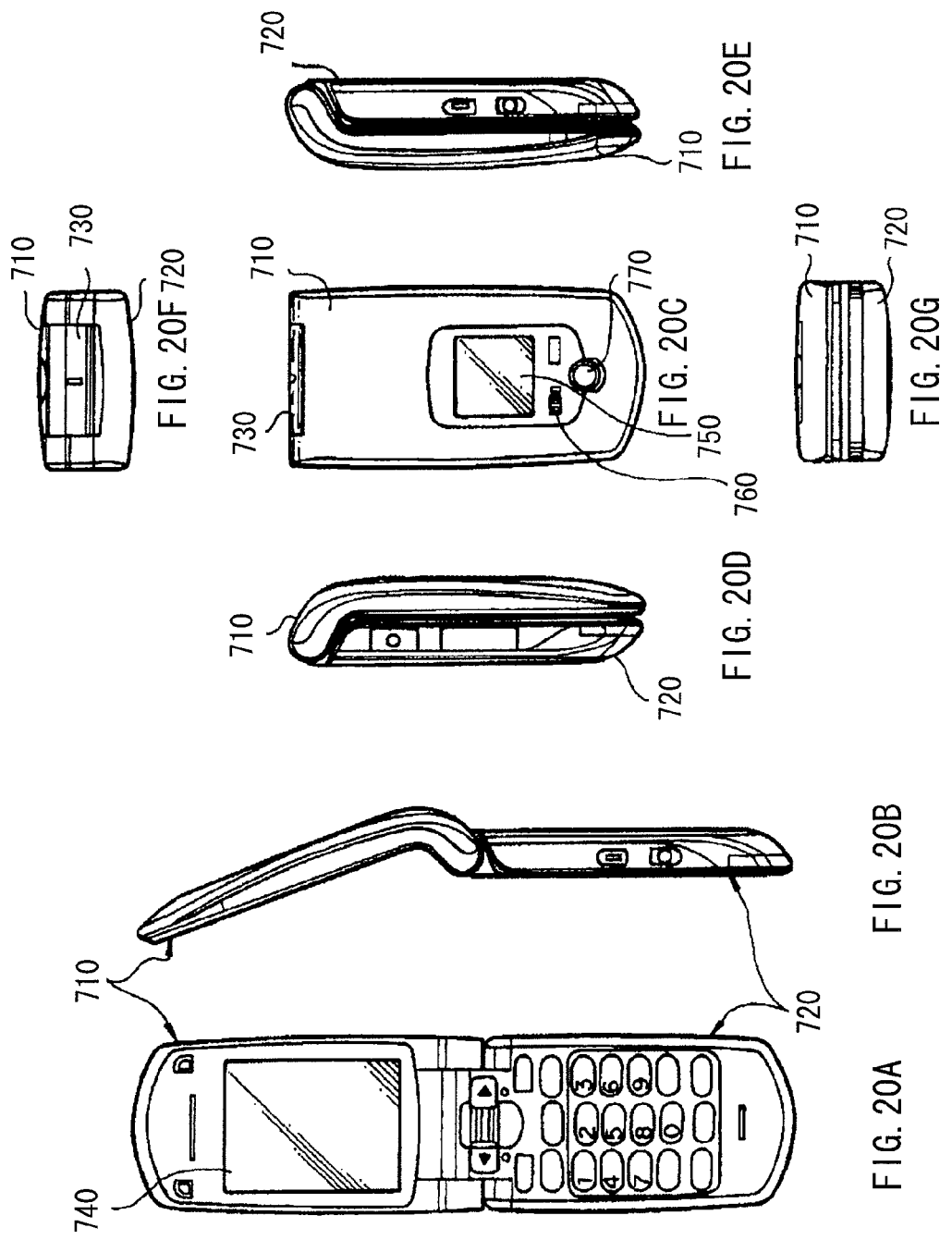

THIN FILM TRANSISTOR, METHOD OF MANUFACTURING THIN FILM TRANSISTOR, DISPLAY UNIT, AND ELECTRONIC DEVICE

BACKGROUND OF THE INVENTION

1. Field of the Invention

The present invention relates to a thin film transistor (TFT) using an oxide semiconductor, a method of manufacturing the same, and a display unit including the same and an electronic device.

2. Description of the Related Art

In a flat panel display such as a liquid crystal display and an organic EL (electroluminescence) display, a silicon (Si) material is typically used as a channel layer (active layer) in a drive thin film transistor. Specifically, examples of the silicon material include an amorphous Si and a polycrystalline Si.

However, in the case where the amorphous Si is used as the channel layer, although it is possible to easily increase the size of the display, the mobility of a carrier (for example, an electron) is low as approximately 1 $cm^2/V \cdot s$, and it is thus difficult to realize high performance of the display. Meanwhile, in the case where the polycrystalline Si is used as the channel layer, although the mobility of the carrier is high as approximately 30 $cm^2/V \cdot s$ to 300 $cm^2/V \cdot s$, variation of transistor characteristics is large in the plane, and it is thus difficult to increase the size of the display.

From these, development of a channel material having in-plane uniformity of the same level as the amorphous Si, and the carrier mobility of the same level as the polycrystalline Si is desired to realize both of an increase in size and high performance in the flat panel display.

Thus, an oxide semiconductor such as a zinc oxide, or an indium gallium zinc oxide (InGaZnO), in particular, amorphous $InGaZnO_4$ or the like has been widely considered as a candidate of the channel material (for example, Japanese Unexamined Patent Publication No. 2007-281409).

SUMMARY OF THE INVENTION

Such an oxide semiconductor may be formed as a film by using sputtering which is advantageous to increase the size. Further, despite an amorphous phase of the oxide semiconductor, the carrier mobility is approximately 10 $cm^2/V \cdot s$, and it is thus possible to obtain the mobility higher than that of the amorphous Si.

Meanwhile, as seen from the oxide semiconductor which has long been used as a gas sensor, changes in characteristics of the oxide semiconductor caused by absorption/desorption of oxygen are remarkable. Therefore, in the case where the oxide semiconductor is used as the channel layer of TFT, there is such an issue that the transistor characteristics (transfer characteristics) are changed when the oxide semiconductor layer is in contact with outside air.

Various protective films are utilized to suppress the changes in characteristics described above. Examples of the protective films include high-performance protective films of $SiO_2$ or SiN formed by using, for example, PECVD (plasma-enhanced chemical vapor deposition).

However, when these protective films are formed, there is a possibility that hydrogen as a donor is mixed into the oxide semiconductor layer, and desorption of the oxygen occurs, thereby allowing the transistor characteristics to be easily varied. Thus, after the protective films are formed, an annealing process in an oxygen atmosphere is necessary for characteristic recovery.

Even in the case where mixture of the hydrogen and desorption of the oxygen do not occur, a carrier density in the oxide semiconductor layer is increased due to heat during the process, and this may allow a threshold voltage to shift to a negative (−(minus)) side. In this case, it is necessary to return the threshold voltage to a positive (+(plus)) side, for example, by performing the annealing for a long time in the oxygen atmosphere. Alternatively, the film thickness of the oxide semiconductor layer itself is thinned in expectation of the shift amount to the negative side as described above, and it is thus possible to control the threshold voltage to be on the positive side. However, in this case, the film thickness is necessarily extremely-thin, and it is difficult to ensure process reproductivity.

In this manner, in the TFT using the oxide semiconductor as the channel layer, it is difficult to control the threshold voltage because of the increase in the carrier density of the oxide semiconductor itself caused by the formation process of the protective film and the annealing. Therefore, it is desired to realize the thin film transistor capable of easily controlling the threshold voltage.

In view of the foregoing, it is desirable to provide a thin film transistor capable of easily controlling a threshold voltage, a method of manufacturing the same, and a display unit using the same and an electronic device.

According to an embodiment of the present invention, there is provided a thin film transistor including: a gate electrode; a pair of source/drain electrodes; a first oxide semiconductor layer provided between the gate electrode, and the pair of source/drain electrodes, and forming a channel; and a second oxide semiconductor layer provided on the pair of source/drain electrodes side of the first oxide semiconductor layer, and having a polarity different from that of the first oxide semiconductor layer.

According to an embodiment of the present invention, there is provided a method of manufacturing a thin film transistor including steps of: forming a first oxide semiconductor layer forming a channel; and forming a second oxide semiconductor layer provided above the first oxide semiconductor layer, and having a polarity different from that of the first oxide semiconductor layer.

In the thin film transistor and the method of manufacturing the thin film transistor according to the embodiments of the present invention, the second oxide semiconductor layer having the polarity different from that of the first oxide semiconductor layer is provided above the first oxide semiconductor layer (on the pair of source/drain electrodes side) forming the channel. Thereby, accumulation of a carrier is suppressed in the first oxide semiconductor layer, and a threshold voltage is thus controlled.

According to an embodiment of the present invention, there is provided a display unit including: a display element; and the thin film transistor driving the display element.

According to an embodiment of the present invention, there is provided an electronic device including the display unit.

According to the thin film transistor, and the method of manufacturing the thin film transistor of the embodiments of the present invention, the second oxide semiconductor layer having the polarity different from that of the first oxide semiconductor layer is provided above the first oxide semiconductor layer (on the pair of source/drain electrodes side) forming the channel. Thereby, a carrier density in the first oxide semiconductor layer is reduced, and the threshold voltage may be maintained to be a positive (+) value. In other words, it is not necessary to separately perform other processes to shift the threshold voltage from a negative side to a positive side, such as annealing for a long time, and thinning the oxide semiconductor layer. Therefore, the threshold voltage is easily controllable.

Other and further objects, features and advantages of the invention will appear more fully from the following description.

BRIEF DESCRIPTION OF THE DRAWINGS

FIGS. 3A to 3C are cross-sectional views illustrating a step subsequent to FIGS. 2A to 2C.

FIG. 20A is an elevation view of a fifth application example unclosed, FIG. 20B is a side view thereof, FIG. 20C is an elevation view of the fifth application example closed, FIG. 20D is a left side view thereof, FIG. 20E is a right side view thereof, FIG. 20F is a top view thereof, and FIG. 20G is a bottom view thereof.

DETAILED DESCRIPTION OF THE PREFERRED EMBODIMENTS

Embodiments of the invention will be hereinafter described in detail with reference to the drawings. The description will be given in the following order:

1. First embodiment (example where a p-type oxide semiconductor layer is formed by an oxidation treatment)
2. Second embodiment (example where the p-type oxide semiconductor layer is formed by patterning)
3. Third embodiment (example where the p-type oxide semiconductor layer is formed by an impurity introduction treatment)
4. Modification (example of a top-gate type TFT)
5. Application examples (application examples to a display unit and an electronic device)
1. First Embodiment
Structure of TFT 1

Figure 1:
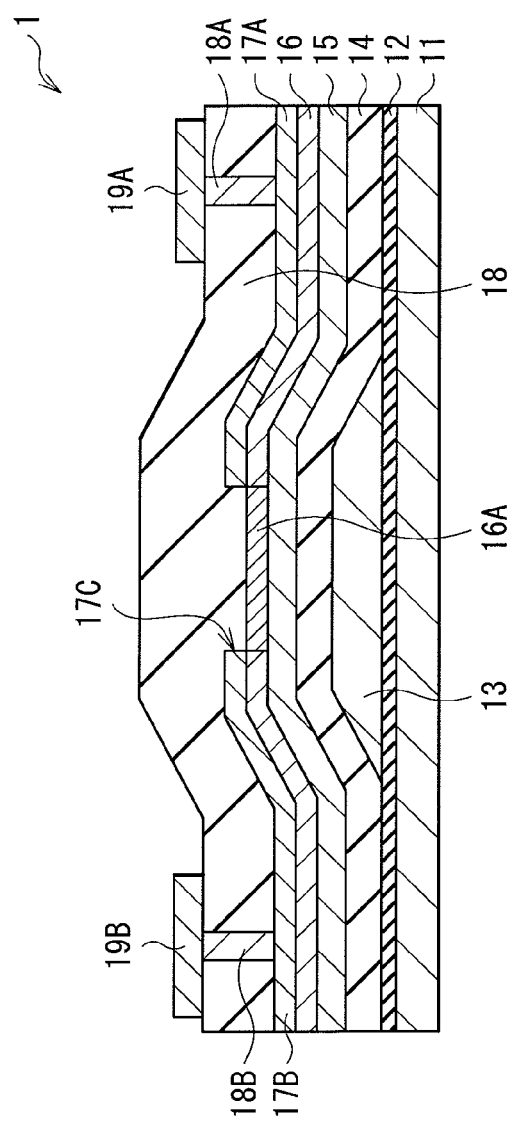
FIG. 1 is a cross-sectional view illustrating a structure of a TFT according to a first embodiment of the present invention.

FIG. 1 illustrates a cross-sectional structure of a thin film transistor (TFT1) according to a first embodiment of the present invention. The TFT 1 is a so-called bottom-gate type (inversely staggered structure) TFT, and includes an insulating film 12, a gate electrode 13, a gate insulating film 14, and an n-type oxide semiconductor layer 15 in this order on a substrate 11. Source/drain electrodes 17A and 17B are provided above the n-type oxide semiconductor layer 15 (a first oxide semiconductor layer) with a p-type oxide semiconductor layer 16A (a second oxide semiconductor layer) and a metal layer 16 in between. In this embodiment, the n-type oxide semiconductor layer 15 serves as a channel layer, and the p-type oxide semiconductor layer 16A is formed in a predetermined region above the n-type oxide semiconductor layer 15. In other words, the TFT1 has a dual-layer structure in which the n-type oxide semiconductor layer 15 serving as the channel layer, and the p-type oxide semiconductor layer 16A exhibiting a reverse polarity of that of the n-type oxide semiconductor layer 15 are stacked to form a pn junction.

Although the substrate 11 is, for example, a silicon substrate, the substrate 11 may be made of other materials such as quart, glass, metal, resin, or a resin film. The insulating film 12 is constituted of, for example, an insulating film material including silicon (Si).

The gate electrode 13 is an electrode controlling a carrier density (here, an electron density) of a channel part in the n-type oxide semiconductor layer 15 according to a gate voltage applied to the TFT1. The gate electrode 13 is, for example, a single-layer film of molybdenum (Mo), aluminum (Al), or an aluminum alloy, or a multilayer film of those. In addition, examples of the aluminum alloy include an aluminum-neodymium alloy.

For example, like the insulating film 12, the gate insulating film 14 is constituted of the insulating film material including silicon. The gate insulating film 14 is, for example, formed over the whole substrate 11 including the gate electrode 13.

The n-type oxide semiconductor layer 15 contains, for example, MO (M is one or more of Al, Ga, In, Zn, Sn, and Ti) as a major component. The carrier mobility in the oxide semiconductor is higher than that of an amorphous Si, and, for example, the carrier mobility in an amorphous $InGaZnO_4$ is high as approximately 10 $cm^2/V \cdot S$, despite of an amorphous phase. In the n-type oxide semiconductor layer 15, the thickness is, for example, 10 nm to 100 nm both inclusive, and the carrier density is maintained, for example, in a range of $10^{14}$ $cm^{-3}$ to $10^{16}$ $cm^{-3}$ both inclusive. In this embodiment, the n-type oxide semiconductor layer 15 serves as the channel layer, and an electron is used as a carrier.

The p-type oxide semiconductor layer 16A contains, for example, MO (M is one or more of Ni, Mn, Cu, and Co) as a major component. In this embodiment, the p-type oxide semiconductor layer 16A is provided in a part of a region above the n-type oxide semiconductor layer 15, and the part of the region is formed by performing an oxidation treatment on a part of the metal layer 16. In other words, the metal layer 16 is constituted of metal (metal before being oxidized) to become a base material of the p-type oxide semiconductor layer 16A, and is formed continuously with the p-type oxide semiconductor layer 16A in an in-plane direction. Specifically, the p-type oxide semiconductor layer 16A is formed in a region facing a separation groove 17C between the source/drain electrodes 17A and 17B, and the other region is the metal layer 16.

In the p-type oxide semiconductor layer 16A, the thickness is, for example, 10 nm to 100 nm both inclusive, and the carrier density is maintained, for example, in a range of $10^{14}$ cm$^{-3}$ to $10^{16}$ cm$^{-3}$ both inclusive. The material and the film thickness are appropriately set in accordance with a combination of the material, the film thickness, and the carrier density of the n-type oxide semiconductor layer 15. However, although will be described later in detail, an upper end position of a valence band in an energy level is preferably set to be higher in the p-type oxide semiconductor layer 16A compared with the n-type oxide semiconductor layer 15.

The source/drain electrodes 17A and 17B are each formed of, for example, metal such as molybdenum, aluminum, and titanium, or a multilayer film of those, and is arranged above the gate electrode 13 with the gate insulating film in between. The source/drain electrodes 17A and 17B are separated from each other by the separation groove 17C in the region facing the gate electrode 13, one of them serves as a source, and the other of them serves as a drain.

On the source/drain electrodes 17A and 17B, a protective film 18 is, for example, formed of the same material as the insulating film 12. In the protective film 18, through electrodes (contact portions) 18A and 18B are provided corresponding to the source/drain electrodes 17A and 17B, respectively. Wirings 19A and 19B are electrically connected to the source/drain electrodes 17A and 17B by the through electrodes 18A and 18B.

Method of Manufacturing TFT1

FIGS. 2A to 2C, and 3A to 3C illustrate cross-sectional views of an example of a manufacturing process of the TFT1. The TFT 1 may be manufactured, for example, as will be described next.

Figure 2A:
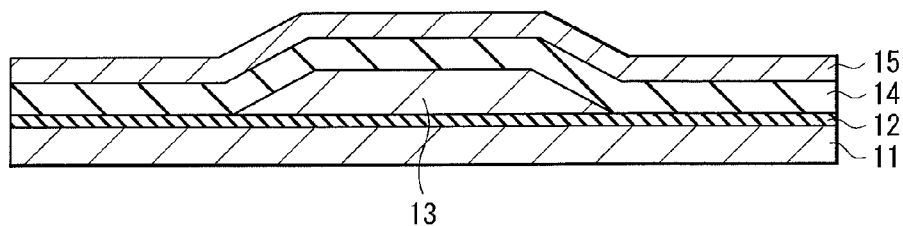
FIGS. 2A to 2C are cross-sectional views illustrating a method of manufacturing the TFT illustrated in FIG. 1 in a process order.

First, as illustrated in FIG. 2A, a SiO$_x$ (silicon oxide) layer is formed on the substrate 11 of glass or the like through, for example, CVD (chemical vapor deposition), and the insulating film 12 is thus formed. Next, after a molybdenum (Mo) layer is formed through, for example, sputtering, the gate electrode 13 is formed through photolithography and dry etching. Next, the gate insulating film 14 is formed over the whole surface of the substrate 11 through, for example, plasma CVD. Thereafter, the n-type oxide semiconductor layer 15 is formed through the sputtering (for example, DC/RF sputtering) using a target of an oxide semiconductor made of the above-described material, or pulsed laser deposition.

Figure 2B:
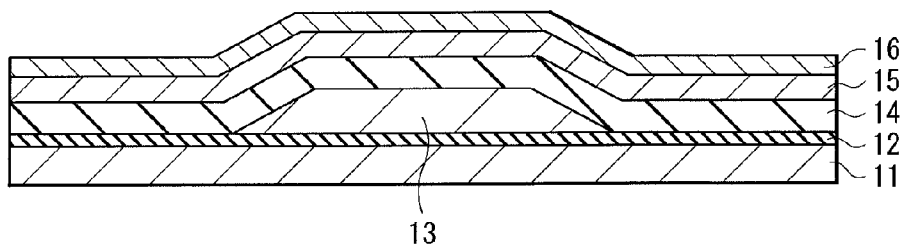

Next, as illustrated in FIG. 2B, the metal layer 16 of the above-described material is formed on the n-type oxide semiconductor layer 15 through the sputtering (DC/RF sputtering or the like), the pulsed laser deposition, or the like in vacuum. At this time, it is preferable to consistently perform a series of steps for forming the n-type oxide semiconductor layer 15 and the metal layer 16 without being exposed to an air.

Figure 2C:
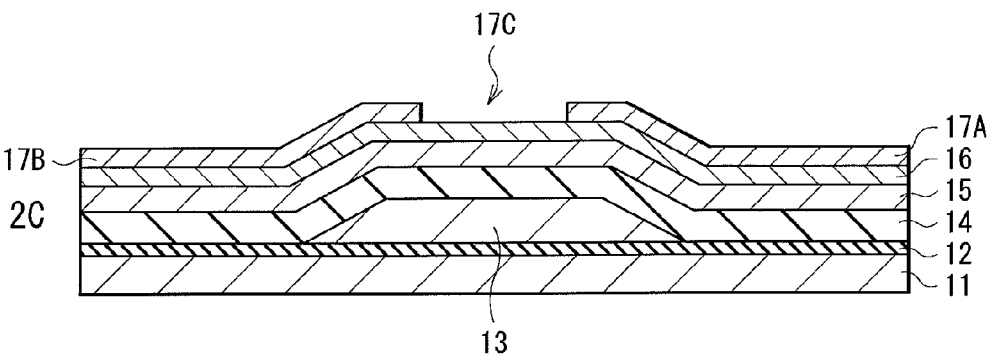

Next, as illustrated in FIG. 2C, after the Mo layer is formed to a thickness of approximately 100 nm through, for example, the sputtering, the separation groove 17C is provided in the region facing the gate electrode 13 through, for example, the dry etching using an oxygen-containing Cl$_2$CF$_4$ gas. Thereby, the source/drain electrodes 17A and 17B are formed.

Next, as illustrated in FIG. 3A, the oxidation treatment such as thermal oxidation and plasma oxidation is performed using the formed source/drain electrodes 17A and 17B as a mask. Thereby, in the metal layer 16, the region facing the separation groove 17C between the source/drain electrodes 17A and 17B is oxidized, and the p-type oxide semiconductor layer 16A is thus formed. Meanwhile, the metal layer 16 is not oxidized and remains as it is in the region shielded by the source/drain electrodes 17A and 17B (FIG. 3B).

Next, as illustrated in FIG. 3C, a SiN (silicon nitride) film is formed on the whole surface through, for example, the CVD, and the protective film 18 is thus formed. Next, a part of the protective film 18 is selectively removed through, for example, the dry etching using an oxygen-containing C$_2$HF$_5$ gas, and through holes 180A and 180B are formed. The through electrodes 18A and 18B are buried in the through holes 180A and 180B through, for example, the sputtering, and then the wirings 19A and 19B are formed. As described above, the bottom-gate type TFT1 illustrated in FIG. 1 is completed.

Actions and Effects of TFT 1

In the TFT1, when a voltage (gate voltage) equal to or larger than a predetermined threshold voltage is applied to the gate electrode 13, the channel is formed in the n-type oxide semiconductor layer 15. Thereby, a current (drain current) flows between the source/drain electrodes 17A and 17B, and this serves as a transistor.

Figure 4:
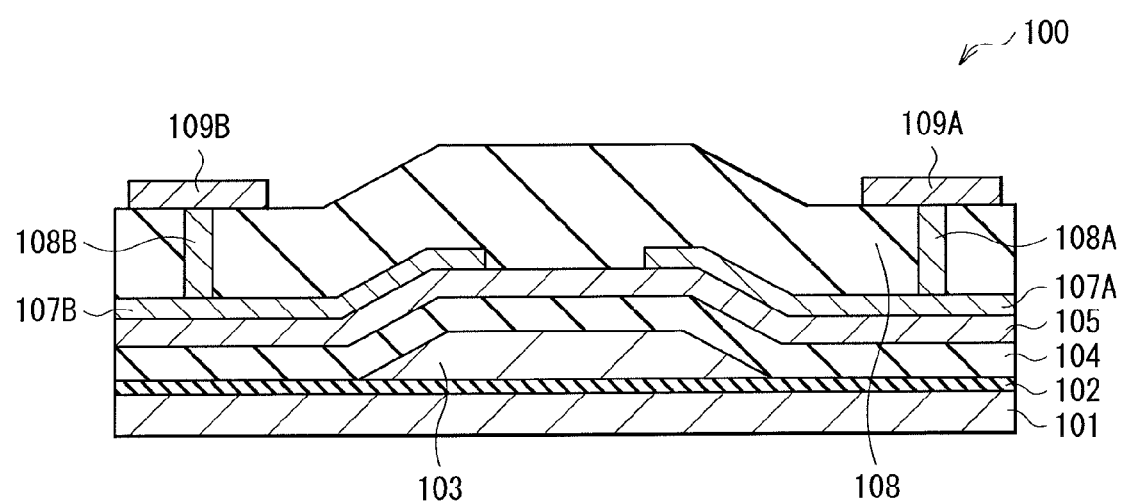
FIG. 4 is a cross-sectional view illustrating a structure of a TFT according to a comparative example.
Figure 5A:
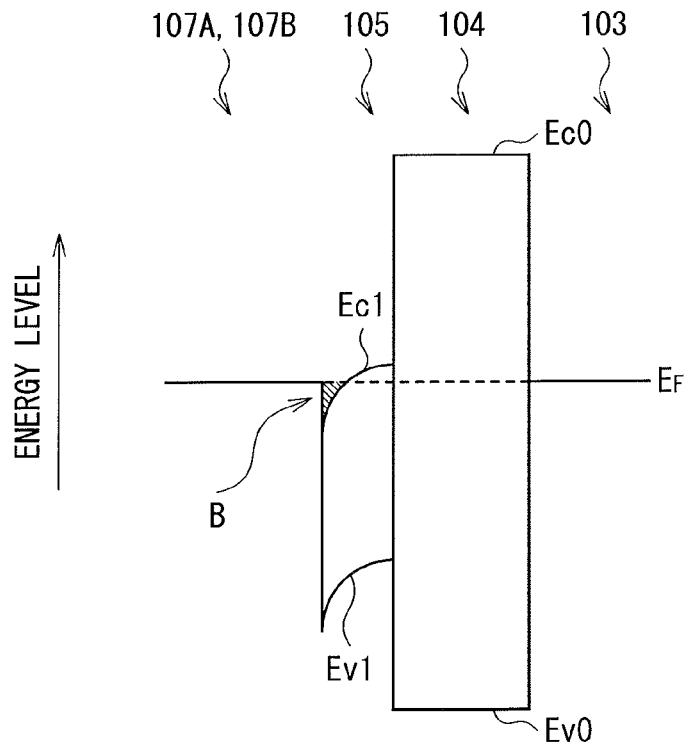
FIGS. 5A and 5B are views illustrating an energy band structure in the vicinity of an oxide semiconductor layer illustrated in FIG. 4.
Figure 5B:
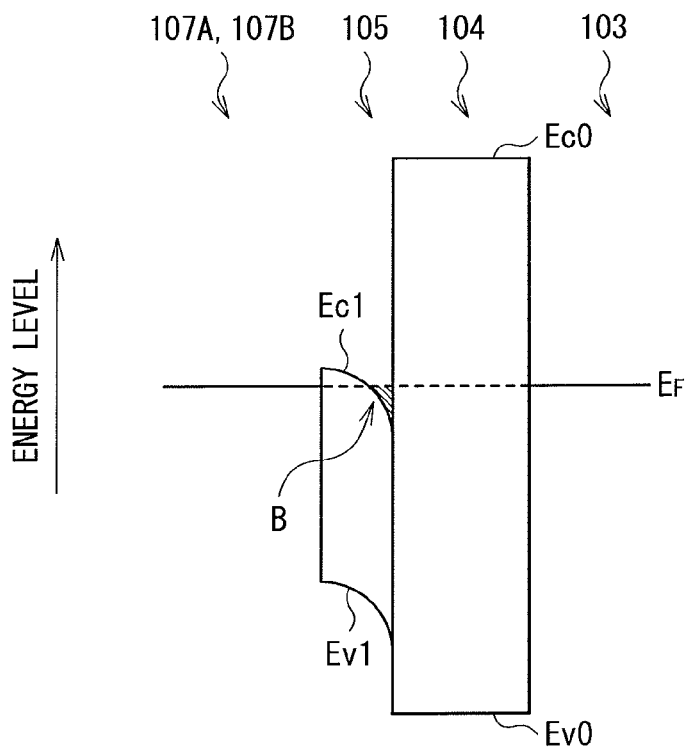

Here, an energy band structure in the vicinity of the oxide semiconductor layer serving as the channel will be described with a comparative example. FIG. 4 illustrates a cross-sectional structure of a TFT100 according to the comparative example, and FIGS. 5A and 5B illustrate the energy band structure in the vicinity of an oxide semiconductor layer 105 (a gate electrode 103, a gate insulating film 104, the oxide semiconductor layer 105, and source/drain electrodes 107A and 107B). In FIGS. 5A and 5B, "Ef" represents Fermi energy. Further, "Ev0" and "Ev1" represent an upper end level of the valence band in the gate insulating film 104 and the oxide semiconductor layer 105, respectively, and "Ec0" and "Ec1" represent a lower end level of a conduction band in the gate insulating film 104 and the oxide semiconductor layer 105, respectively.

The TFT 100 is a bottom-gate type TFT, and includes an insulating film 102, the gate electrode 103, the gate insulating film 104, and the oxide semiconductor layer 105 in this order on a substrate 101. The source/drain electrodes 107A and 107B are provided on the oxide semiconductor layer 105, and a protective film 108 is formed on the source/drain electrodes 107A and 107B. The source/drain electrodes 107A and 107B are connected to wirings 109A and 109B via through electrodes 108A and 108B buried in the protective film 108.

In a manufacturing process of the TFT100, after the oxide semiconductor layer 105 is formed, the protective film 108 is formed through a formation process of the source/drain electrodes 107A and 107B. Because of the reasons which will be described later, after forming the protective film 108, the annealing in the oxygen atmosphere is carried out. After forming the oxide semiconductor layer 105, there is a case where an etch stopping layer (channel protective film) not illustrated in the figure is formed before forming the source/drain electrodes 107A and 107B, and the annealing is carried out after forming the protective film 108 even in this case.

In the formation process of the protective film 108 and the etch stopping layer in the comparative example, hydrogen as a donor is mixed into the oxide semiconductor layer, and transistor characteristics are thereby easily changed. It is considered that this is because the carrier is accumulated on the surface side of the oxide semiconductor layer 105 due to mixture of the hydrogen into the surface (face on the source/drain electrodes side) of the oxide semiconductor layer 105, desorption of the oxygen from the surface, or the like as illustrated in B of FIG. 5A. Thus, after the protective film 108 and the etch stopping layer are formed, the annealing process in the oxygen atmosphere is necessary to recover the characteristics.

Even in the case where the hydrogen and the oxygen do not enter and exit, the carrier density of the oxide semiconductor layer 105 itself is increased due to the heat during the process or the like, the carrier is accumulated on the gate insulating film 104 side as illustrated in B of FIG. 5B, and the threshold voltage may be shifted to a negative side. In this case, for example, it is necessary to carry out the annealing in the oxygen atmosphere for a long time to return the threshold voltage to a positive side. Alternatively, the threshold voltage is easily shifted to the positive side when the film thickness of the oxide semiconductor layer 105 itself is thinned. However, in this case, in particular, when the original carrier density of the oxide semiconductor layer 105 is high, the film thickness is necessarily extremely-thin, and it is difficult to ensure process reproductivity.

Figure 6:
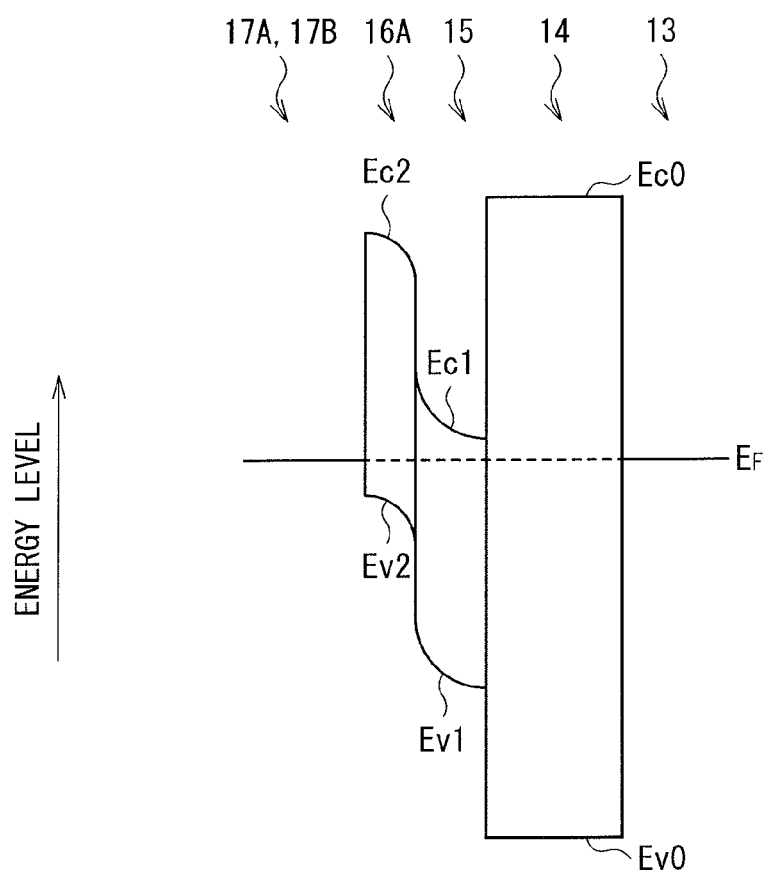
FIG. 6 is a view illustrating the energy band structure in the vicinity of the oxide semiconductor layer illustrated in FIG. 1.

Meanwhile, in this embodiment, on the source/drain electrodes 17A and 17B side of the n-type oxide semiconductor layer 15 serving as the channel layer, the p-type oxide semiconductor layer 16A exhibiting a reverse polarity of that of the n-type oxide semiconductor layer 15 is stacked, that is, a pn junction is formed. Here, FIG. 6 illustrates the energy band structure in the vicinity of the n-type oxide semiconductor layer 15 (the gate electrode 13, the gate insulating film 14, the n-type oxide semiconductor layer 15, the p-type oxide semiconductor layer 16A, and the source/drain electrodes 17A and 17B). In FIG. 6, "Ef" represents the Fermi energy. Further, the upper end level of the valence band in the gate insulating film 14, the n-type oxide semiconductor layer 15, and the p-type oxide semiconductor layer 16A is represented as "Ev0", "Ev1", and "Ev2", respectively, and the lower end level of the conduction band is represented as "Ec0", "Ec1", and "Ec2", respectively.

Since the p-type oxide semiconductor layer 16A is provided on the n-type oxide semiconductor layer 15, the energy band of the n-type oxide semiconductor layer 15 has a shape as illustrated in FIG. 6, and a structure in which the accumulated carrier is difficult to be held is obtained. Therefore, the threshold voltage is maintained to be a positive value. In other words, the process to shift the threshold voltage from the negative side to the positive side, such as annealing for a long time, and thinning the n-type oxide semiconductor layer 15, is not necessary.

Further, process resistance (ability to prevent mixture of the hydrogen, and desorption of the oxygen during the process) in the n-type oxide semiconductor layer 15 is improved. Thus, even in the case where the protective film 18 is formed on the p-type oxide semiconductor layer 16A through the PECVD or the like described above, it is possible to avoid influence on the TFT characteristics during the process. Further it is possible to give higher process resistance to the n-type oxide semiconductor layer 15 by appropriately selecting the material and the film thickness of the p-type oxide semiconductor layer 16A. In other words, the annealing process to recover the characteristics as performed after forming the protective film of the related art is not necessary.

As illustrated in FIG. 6, the upper end level of the valence band Ev2 in the p-type oxide semiconductor layer 16A is preferably energetically lower than the upper end level of the valence band Ev1 in the n-type oxide semiconductor layer 15 (Ev2<Ev1). Thereby, the accumulation of the hole is suppressed in the vicinity of a pn interface between the n-type oxide semiconductor layer 15 and the p-type oxide semiconductor layer 16A. In the case where the electron is used as the carrier, since the electron transits in the vicinity of the pn interface, it is not preferable for the hole to accumulate in the vicinity of the pn interface. Meanwhile, the energy band structure on the conduction band side is not specifically limited. Here, the lower end level of the conduction band Ec2 in the p-type oxide semiconductor layer 16A is energetically higher than the lower end level of the conduction band Ec1 in the n-type oxide semiconductor layer 15 (Ec2>Ec1).

As described above, in this embodiment, on the n-type oxide semiconductor layer 15 serving as the channel layer, the p-type oxide semiconductor layer 16A exhibiting a reverse polarity of that of the n-type oxide semiconductor layer 15 is provided, that is, the pn junction is formed. Thereby, the carrier density in the n-type oxide semiconductor layer 15 is reduced, and the threshold voltage may be maintained to be the positive value. In other words, it is not necessary to separately perform other processes to shift the threshold voltage from the negative side to the positive side, such as annealing for a long time, and thinning the n-type oxide semiconductor layer 15. Further, since the process resistance of the n-type oxide semiconductor layer 15 is improved, the annealing process to recover the characteristics is not necessary even in the case where the protective film 18 is formed. In other words, the threshold voltage is easily controllable.

2. Second Embodiment

Structure of TFT 2

Figure 7:
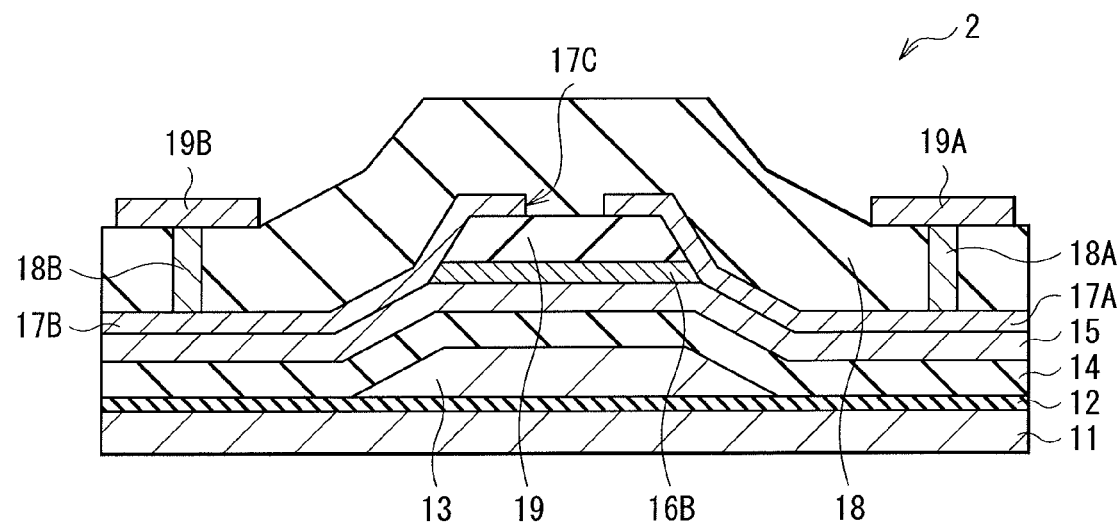
FIG. 7 is a cross-sectional view illustrating the structure of the TFT according to a second embodiment of the present invention.

FIG. 7 illustrates a cross-sectional structure of a thin film transistor (TFT2) according to a second embodiment of the present invention. In addition, same reference numerals will be used for components identical to those of the first embodiment, and description will be appropriately omitted. Like the TFT1 of the first embodiment, the TFT 2 is the bottom-gate type TFT, and includes the insulating film 12, the gate electrode 13, the gate insulating film 14, and the n-type oxide semiconductor layer 15 in this order on the substrate 11. A p-type oxide semiconductor layer 16B is formed on the n-type oxide semiconductor layer 15, and the dual-layer structure to form the pn junction is obtained.

However, in this embodiment, unlike the first embodiment, the p-type oxide semiconductor layer 16B is formed through patterning in a predetermined region (the region facing the separation groove 17C between the source/drain electrodes 17A and 17B) on the n-type oxide semiconductor layer 15. The material, the film thickness, and the like of the p-type oxide semiconductor layer 16B are the same as those of the p-type oxide semiconductor layer 16A of the first embodiment. A channel protective film 19 made of the same material as the insulating film 12 is formed on the surface (the surface on the source/drain electrodes 17A and 17B side) of the p-type oxide semiconductor layer 16B. Further, the source/drain electrodes 17A and 17B are provided to cover the n-type oxide semiconductor layer 15, the p-type oxide semiconductor layer 16B and the channel protective film 19.

Method of Manufacturing TFT2

FIGS. 8A to 8D, and 9A to 9B illustrate cross-sectional views of an example of a manufacturing process of the TFT2. The TFT2 may be manufactured, for example, as will be described next.

Figure 8A:
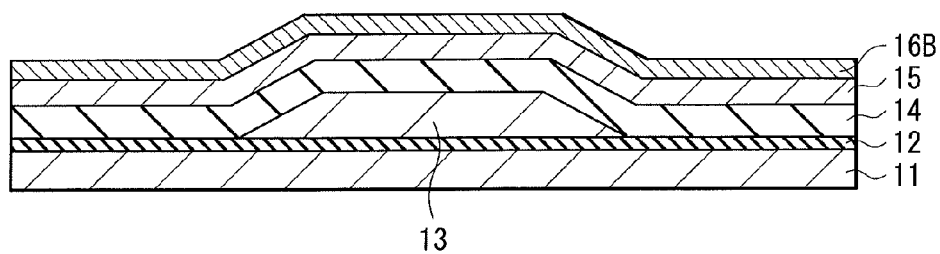
FIGS. 8A to 8D are cross-sectional views illustrating the method of manufacturing the TFT illustrated in FIG. 7 in the process order.

First, as illustrated in FIG. 8A, in the same manner as the first embodiment, the insulating film 12, the gate electrode 13, the gate insulating film 14, and the n-type oxide semiconductor layer 15 are formed in this order on the substrate 11 made of glass or the like. Thereafter, the p-type oxide semiconductor layer 16B is formed over the whole surface of the n-type oxide semiconductor layer 15 through the sputtering (DC/RF sputtering or the like), the pulse laser deposition, or the like in the vacuum. At this time, it is preferable to consistently perform the series of steps for forming the n-type oxide semiconductor layer 15 and the p-type oxide semiconductor layer 16B in the vacuum without being exposed to the air.

Figure 8B:
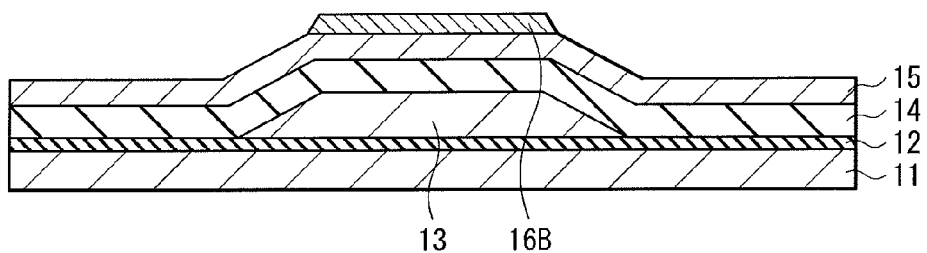

Next, as illustrated in FIG. 8B, in the formed p-type oxide semiconductor layer 16B, after a photoresist is patterned through, for example, photolithography, the photoresist is selectively removed through, for example, the dry etching using a chlorine gas. Thereby, the p-type oxide semiconductor layer 16B is formed through the patterning in a region corresponding to the gate electrode 13 on the n-type oxide semiconductor layer 15.

Figure 8C:
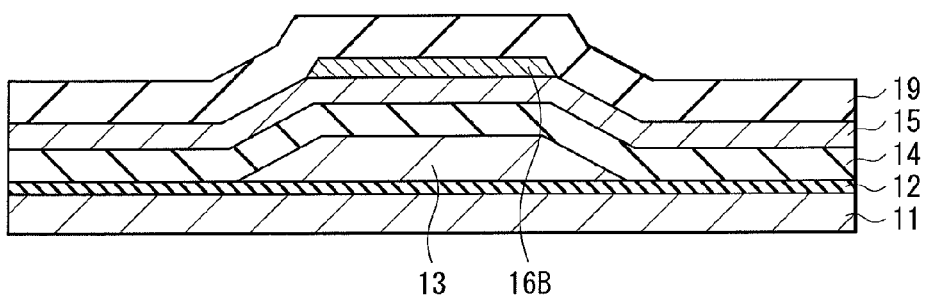
Figure 8D:
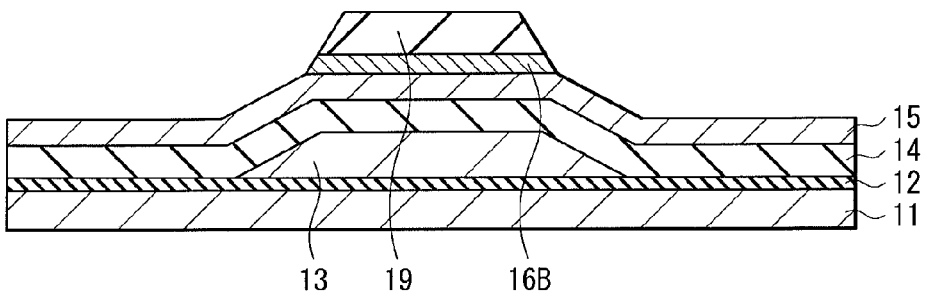

Next, as illustrated in FIG. 8C, for example, the $SiO_x$ layer is formed through the CVD. After the photoresist is patterned through the photolithography, the $SiO_x$ layer is dry-etched using, for example, an oxygen-containing $C_2HF_5$ gas. Thereby, the channel protective film 19 is formed as illustrated in FIG. 8D.

Figure 9A:
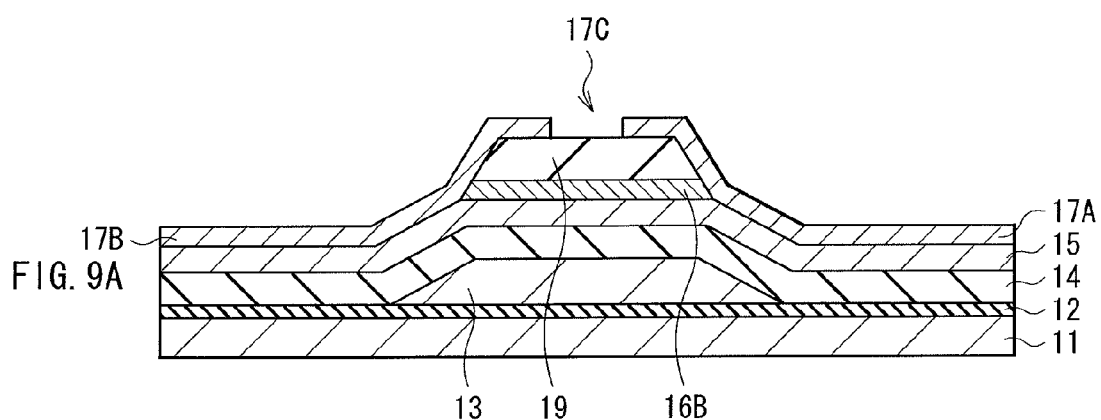
FIGS. 9A and 9B are cross-sectional views illustrating a step subsequent to FIGS. 8A to 8D.

Next, after the Mo layer is formed to cover the n-type oxide semiconductor layer 15, the p-type oxide semiconductor layer 16B, and the channel protective film 19 through, for example, the sputtering, the separation groove 17C is provided in the same manner as the first embodiment. Thereby, the source/drain electrodes 17A and 17B are formed (FIG. 9A).

Figure 9B:
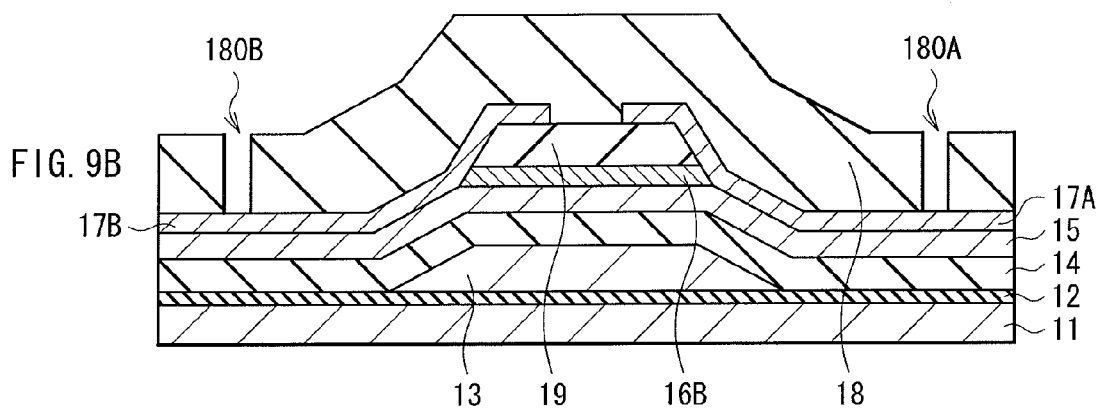

Next, as illustrated in FIG. 9B, the SiN (silicon nitride) film is formed over the whole surface through, for example, the CVD, and the protective film 18 is thus formed. Next, in the same manner as the first embodiment, after the through holes 180A and 180B are formed, the through electrodes 18A and 18B are buried in the through holes 180A and 180B, and the wirings 19A and 19B are formed. As described above, the bottom-gate type TFT 2 illustrated in FIG. 7 is completed.

In the TFT2 of this embodiment, like the TFT1 of the first embodiment, when the voltage equal to or larger than the predetermined threshold voltage is applied to the gate electrode 13, the channel is formed in the n-type oxide semiconductor layer 15. Thereby, the current flows between the source/drain electrodes 17A and 17B, and this serves as the transistor. Further, the p-type oxide semiconductor layer 16B is provided on the n-type oxide semiconductor layer 15 to form the pn junction, and the band structure in which the n-type oxide semiconductor layer 15 has thus difficulty to hold the carrier is obtained. Therefore, the carrier density in the n-type oxide semiconductor layer 15 is reduced, and the threshold voltage is maintained to be the positive value. Thus, it is possible to obtain the same effects as the first embodiment.

3. Third Embodiment

Structure of TFT3

Figure 10:
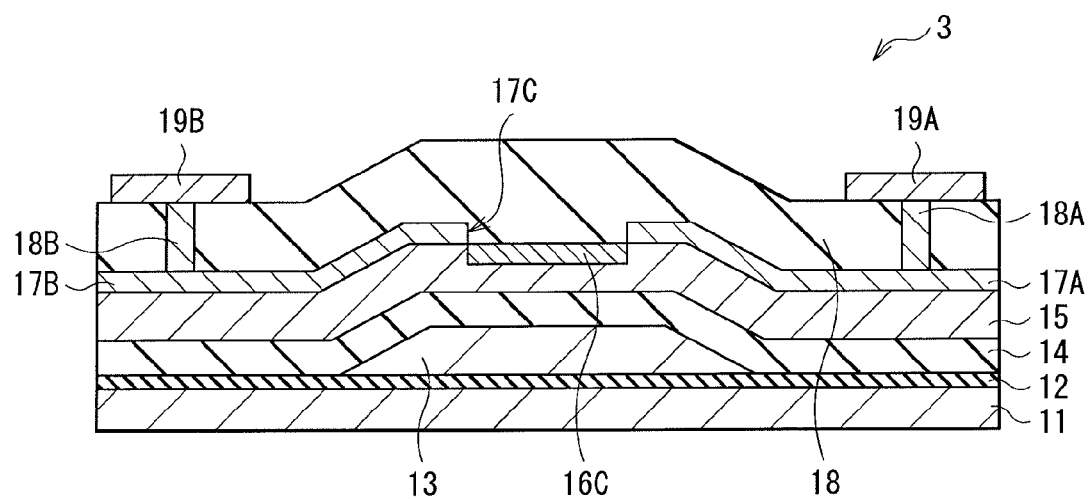
FIG. 10 is a cross-sectional view illustrating the structure of the TFT according to a third embodiment of the present invention.

FIG. 10 illustrates a cross-sectional structure of a thin film transistor (TFT3) according to a third embodiment of the present invention. In addition, same reference numerals will be used for components identical to those of the first embodiment, and description will be appropriately omitted. Like the TFT1 of the first embodiment, the TFT3 is the bottom-gate type TFT, and includes the insulating film 12, the gate electrode 13, the gate insulating film 14, and the n-type oxide semiconductor layer 15 in this order on the substrate 11. The TFT3 has the dual-layer structure of the n-type oxide semiconductor layer 15 and a p-type oxide semiconductor layer 16C.

However, in this embodiment, unlike the first embodiment, the p-type oxide semiconductor layer 16C is buried in a part (a region facing the separation groove 17C between the source/drain electrodes 17A and 17B) of the n-type oxide semiconductor layer 15 on its surface side. Specifically, the p-type oxide semiconductor layer 16C is formed by introducing an acceptor such as an impurity and an ion to the surface of the n-type oxide semiconductor layer 15. The material, the film thickness, and the like of the p-type oxide semiconductor layer 16C are the same as those of the p-type oxide semiconductor layer 16A of the first embodiment.

Method of Manufacturing TFT3

FIGS. 11A to 11D, and 12 illustrate cross-sectional views of an example of a manufacturing process of the TFT3. The TFT3 may be manufactured, for example, as will be described next.

Figure 11:
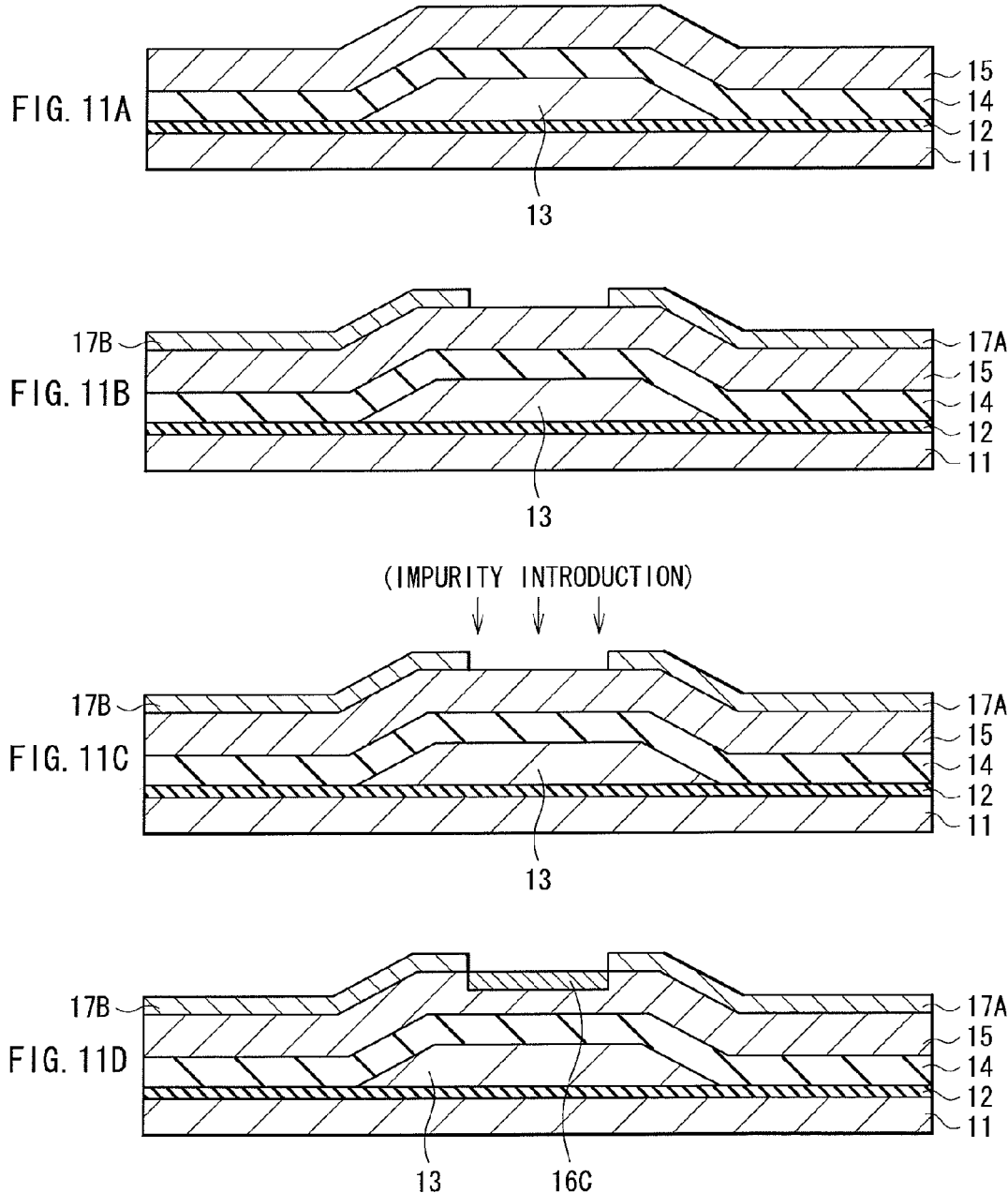
FIGS. 11A to 11D are cross-sectional views illustrating the method of manufacturing the TFT illustrated in FIG. 10 in the process order.

First, as illustrated in FIG. 11A, in the same manner as the first embodiment, the insulating film 12, the gate electrode 13, the gate insulating film 14, and the n-type oxide semiconductor layer 15 are formed in this order on the substrate 11 made of glass or the like.

Next, as illustrated in FIG. 11B, in the same manner as the first embodiment, the source/drain electrodes 17A and 17B are formed.

Next, as illustrated in FIG. 11C, the impurity serving as the acceptor is introduced through impurity diffusion or the like using the formed source/drain electrodes 17A and 17B as a mask. Alternatively, ion implantation may be performed. At this time, the impurity is introduced to only the part of the n-type oxide semiconductor layer 15 on its surface side. In other words, a thin film of the n-type oxide semiconductor layer 15 remains on the gate insulating film 14 side. Thereby, the dual-layer structure of the n-type oxide semiconductor layer 15 and the p-type oxide semiconductor layer 16C is formed in the region facing the separation groove 17C between the source/drain electrodes 17A and 17B (FIG. 11D). Thereafter, in the same manner as the first embodiment, the TFT3 illustrated in FIG. 10 is completed by forming the protective film 18 and the wiring 19A and 19B.

In the TFT3 of this embodiment, like the TFT1 of the first embodiment, when the voltage equal to or larger than the predetermined threshold voltage is applied to the gate electrode 13, the channel is formed in the n-type oxide semiconductor layer 15. Thereby, the current flows between the source/drain electrodes 17A and 17B, and this serves as the transistor. Further, the pn junction is formed by the stacked structure of the n-type oxide semiconductor layer 15 and the p-type oxide semiconductor layer 16C, and the band structure in which the n-type oxide semiconductor layer 15 has thus difficulty to hold the carrier is obtained. Therefore, the carrier density in the n-type oxide semiconductor layer 15 is reduced, and the threshold voltage is maintained to be the positive value. Thus, it is possible to obtain the same effects as the first embodiment.

4. Modification

Figure 12:
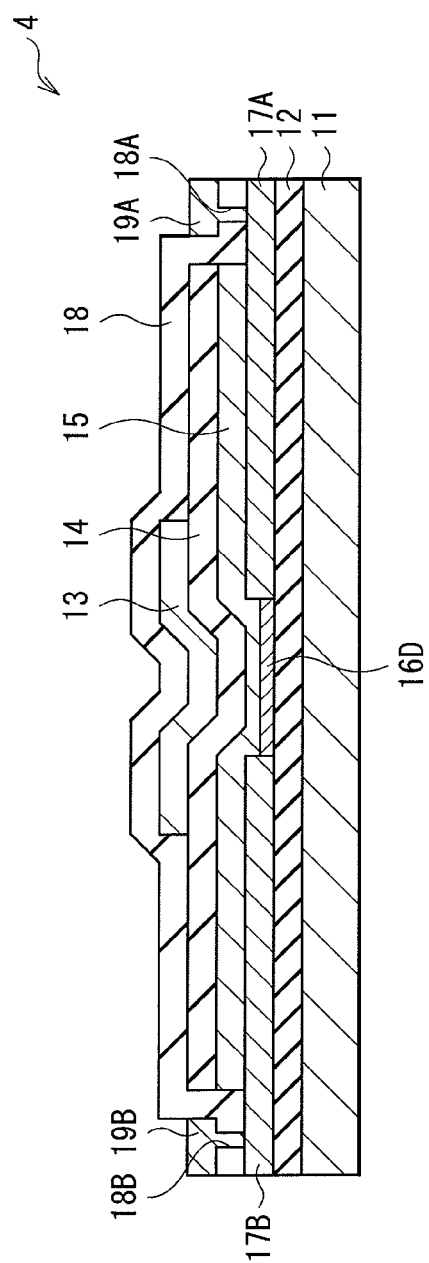
FIG. 12 is a cross-sectional view illustrating the structure of the TFT according to a modification.

FIG. 12 illustrates a cross-sectional structure of a thin film transistor (TFT1 to TFT4) according to a modification of the present invention. The TFT 4 is a so-called top-gate type (staggered structure) TFT, and includes the insulating film 12, the source/drain electrodes 17A and 17B, the n-type oxide semiconductor layer 15, the gate insulating film 14, and the gate electrode 13 in this order on the substrate 11. Further, a p-type oxide semiconductor layer 16D is formed on the source/drain electrodes 17A and 17B side of the n-type oxide semiconductor layer 15, and the dual-layer structure to form the pn junction is obtained. In addition, after the p-type oxide semiconductor layer 16D is formed between the source/drain electrodes 17A and 17B, the dual-layer structure is formed by forming the n-type oxide semiconductor layer 15 to cover the source/drain electrodes 17A and 17B, and the p-type oxide semiconductor layer 16D.

In this manner, the present invention is not limited to the bottom-gate type TFT, but is also applicable to the top-gate type TFT. Also in this modification, the same effects as the above-described embodiments may be obtained.

5. Application Examples

Next, application examples of the thin film transistor (TFT4) according to the first embodiment to the third embodiment, and the modification to a display unit and an electronic device will be described.

Display Unit

Figure 13:
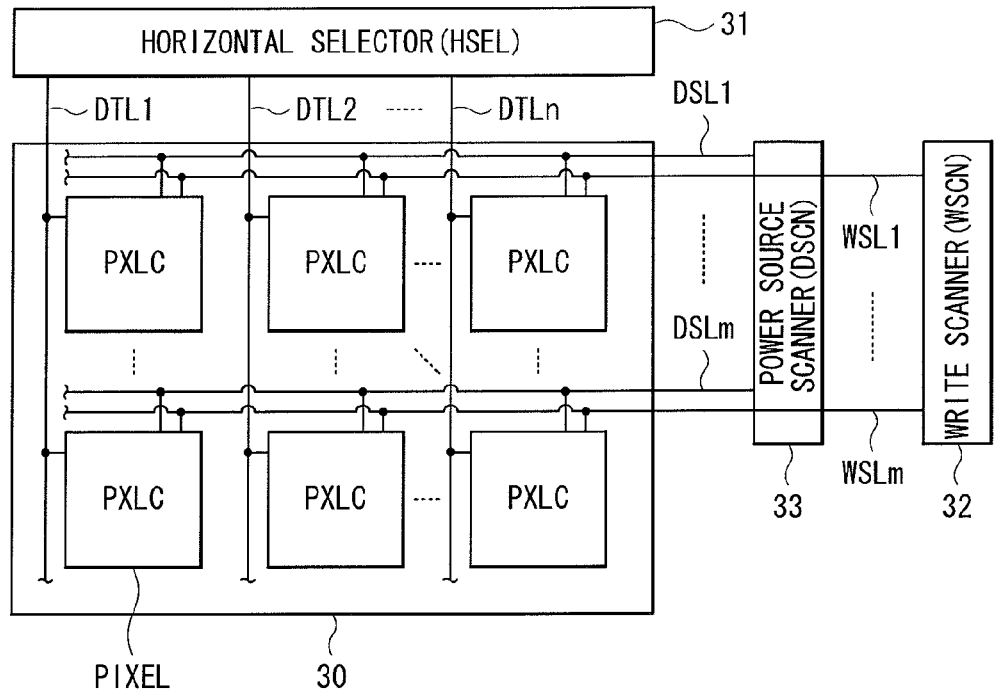
FIG. 13 is a block diagram illustrating a structural example of a display unit including the TFT according to each embodiment and the modification.

FIG. 13 illustrates a structural example of a display unit (a display unit using an organic EL element) used as an organic EL display. The display unit includes, for example, a display region 30 in which a plurality of pixels PXLC including an organic EL element (an organic electroluminescent element) serving as a display element are arranged in a matrix, on a TFT substrate (the substrate 11). A horizontal selector (HSEL) 31 serving as a signal line drive circuit, a write scanner (WSCN) 32 serving as a scanning line drive circuit, and a power source scanner (DSCN) 33 serving as a power source line drive circuit are provided in the vicinity of the display region 30.

In the display region 30, a plurality of (an integer number "n") signal lines DTL1 to DTLn are arranged in a column direction, and a plurality of (an integer number "m") scanning lines WSL1 to WSLm, and a plurality of (an integer number "m") power source lines DSL1 to DSLm are arranged in a row direction, respectively. Further, each pixel PXLC (one of the pixels corresponding to red (R), green (G), and blue (B)) is provided at each intersection of each signal line DTL and each scanning line WSL. Each signal line DTL is connected to the horizontal selector 31, and a video signal is supplied from the horizontal selector 31 to each signal line DTL. Each scanning line WSL is connected to the write scanner 32, and a scanning signal (selection pulse) is supplied from the write scanner 32 to each scanning line WSL. Each power source line DSL is connected to the power source scanner 33, and a power source signal (control pulse) is supplied from the power source scanner 33 to each power source line DSL.

Figure 14:
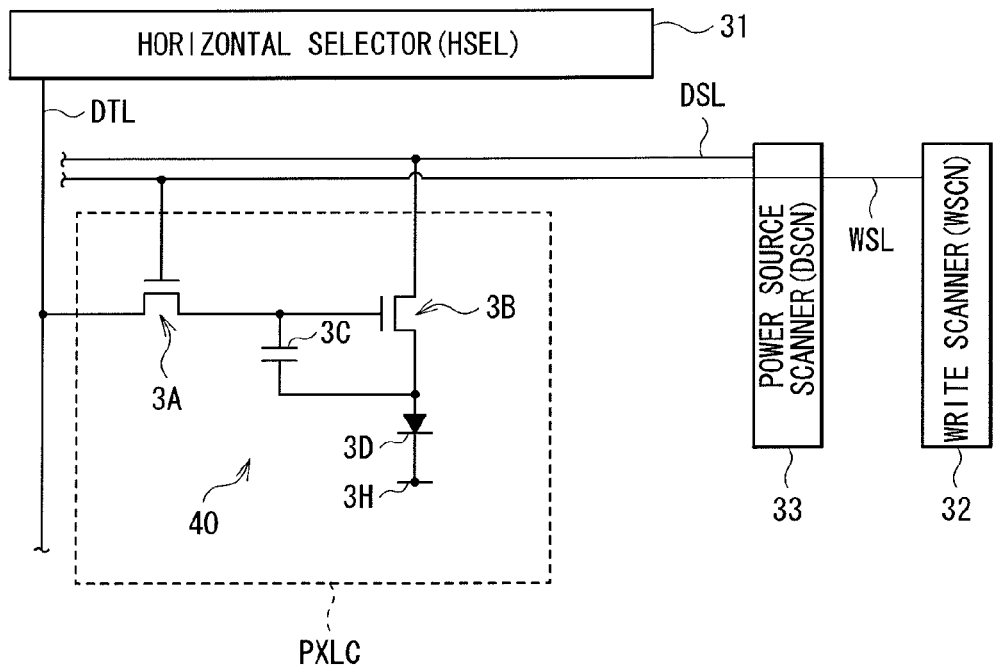
FIG. 14 is a circuit view illustrating a detailed structural example of a pixel illustrated in FIG. 13.

FIG. 14 illustrates an example of a circuit structure in the pixel PXLC. Each pixel PXLC includes a pixel circuit 40 including an organic EL element 3D. The pixel circuit 40 is an active drive circuit including a sampling transistor 3A, a drive transistor 3B, a retention capacity element 3C, and the organic EL element 3D. The transistors 3A and 3B correspond to the thin film transistors (TFT1 to TFT4) of the above-described embodiments.

The sampling transistor 3A is connected to the scanning line WSL to which a gate of the sampling transistor 3A corresponds. In the sampling transistor 3A, one of its source and its gate is connected to the corresponding signal line DTL, and the other is connected to a gate of the drive transistor 3B. The drive transistor 3B is connected to the power source line DSL to which a drain of the drive transistor 3B corresponds, and a source of the drive transistor 3B is connected to an anode of the organic EL element 3D. A cathode of the organic EL element 3D is connected to a ground wiring 3H. In addition, the ground wiring 3H is wired in common to all the pixels PXLC. The retention capacity element 3C is arranged between the source and the gate of the drive transistor 3B.

The sampling transistor 3A samples a signal potential of the video signal supplied from the signal line DTL by being conductive corresponding to the scanning signal (selection pulse) supplied from the scanning line WSL, and holds the signal potential in the retention capacity element 3C. The drive transistor 3B receives supply of a current from the power source line DSL which is set at a first predetermined potential (not illustrated in the figure) and supplies the drive current to the organic EL element 3D corresponding to the signal potential held in the retention capacity element 3C. The organic EL element 3D emits light at luminance corresponding to the signal potential of the video signal with the drive current supplied from the drive transistor 3B.

In this display unit, the sampling transistor 3A is made conductive corresponding to the scanning signal (selection pulse) supplied from the scanning line WSL so that the signal potential of the video signal supplied from the signal line DTL is sampled, and held in the retention capacity element 3C. Further, the current is supplied from the power source line DSL set at the first potential to the drive transistor 3B, and the drive current is supplied to the organic EL element 3D (each organic EL element of red, green, and blue) corresponding to the signal potential held in the retention capacity element 3C. Each organic EL element 3D emits the light at the luminance corresponding to the signal potential of the video signal with the supplied drive current. Thereby, the video is displayed based on the video signal in the display unit.

Electronic Device

Hereinafter, application examples of the display unit to electronic devices will be described. The display unit is applicable to electronic devices of various fields, such as a television device, a digital camera, a notebook personal computer, a mobile terminal device such as a mobile phone, or a video camera. In other words, the display unit is applicable to the electronic devices of various fields in which a video signal input from the external or a video signal generated inside the electronic device is displayed as an image or a video.

Module

Figure 15:
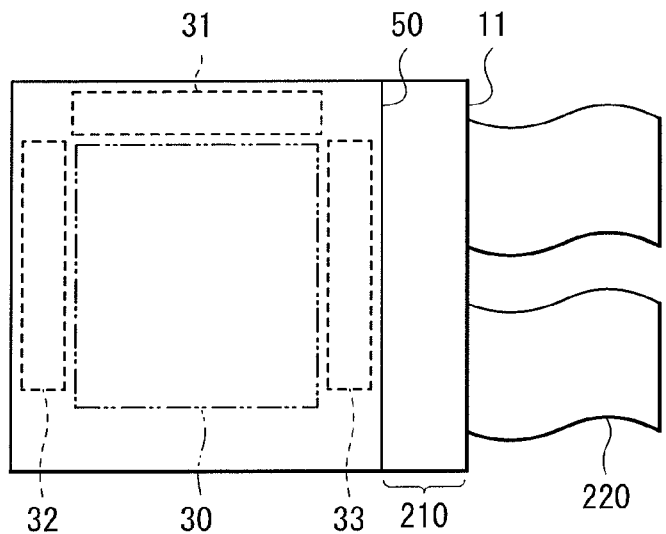
FIG. 15 is a plan view illustrating a schematic structure of a module including the display unit illustrated in FIG. 13.

The display unit is installed as a module, for example, as illustrated in FIG. 15 in various electronic devices such as first to fifth application examples which will be described later, or the like. In the module, for example, a region 210 exposed from a sealing substrate 50 is provided in one side of the substrate 11, and an external connection terminal (not illustrated in the figure) is formed in the exposed region 210 by extending wirings of the horizontal selector 31, the write scanner 32, and the power source scanner 33. The external connection terminal may be provided with a flexible printed circuit (FPC) 220 for inputting/outputting a signal.

(First Application Example)

Figure 16:
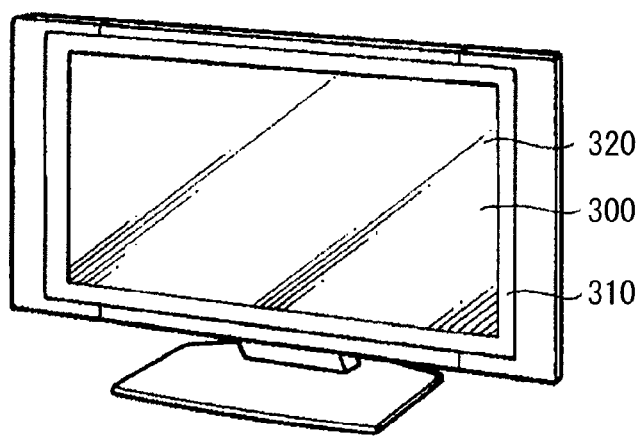
FIG. 16 is a perspective view illustrating an appearance of a first application example of the display unit illustrated in FIG. 13.

FIG. 16 illustrates an appearance of a television device. The television device includes, for example, a video display screen section 300 including a front panel 310 and a filter glass 320, and the video display screen section 300 corresponds to the display unit.

(Second Application Example)

Figure 17A:
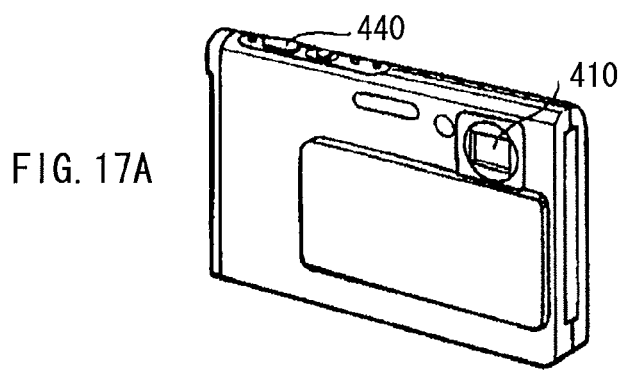
FIG. 17A is a perspective view illustrating an appearance of a second application example as viewed from a front side thereof.
Figure 17B:
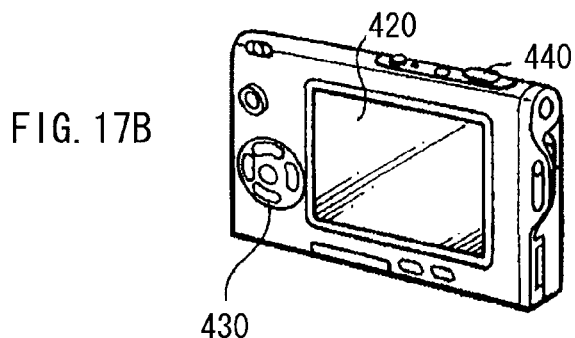
FIG. 17B is a perspective view illustrating an appearance as viewed from a rear side thereof.

FIGS. 17A and 17B illustrate an appearance of a digital camera. The digital camera includes, for example, a light emitting section 410 for a flash, a display section 420, a menu switch 430, and a shutter button 440, and the display section 420 corresponds to the display unit (Third Application Example)

Figure 18:
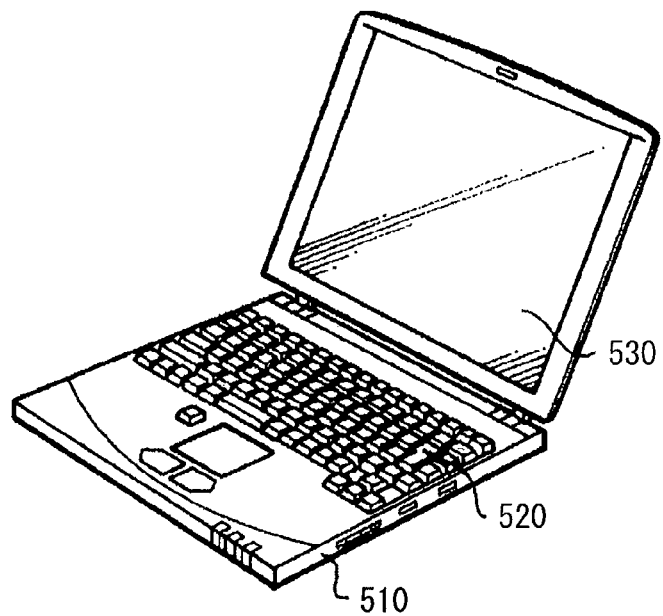
FIG. 18 is a perspective view illustrating an appearance of a third application example.

FIG. 18 illustrates an appearance of a notebook personal computer. The notebook personal computer includes, for example, a main body 510, a keyboard 520 for input operation of characters and the like, and a display section 530 for displaying an image, and the display section 530 corresponds to the display unit.

(Fourth Application Example)

Figure 19:
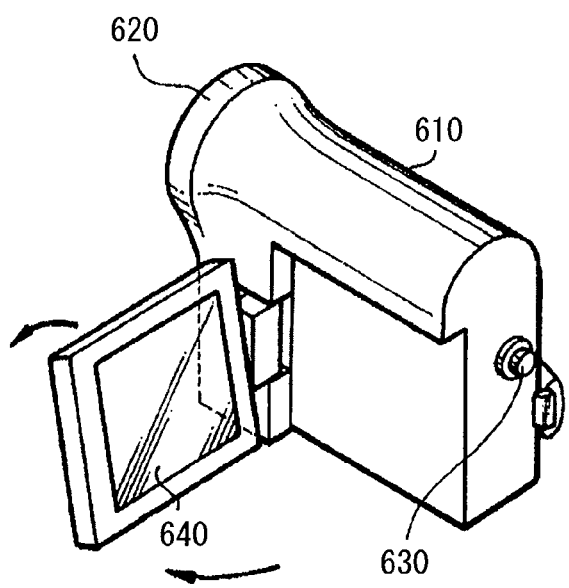
FIG. 19 is a perspective view illustrating an appearance of a fourth application example.

FIG. 19 illustrates an appearance of a video camera. The video camera includes, for example, a main body 610, a lens 620 for capturing an object provided on the front side face of the main body 610, a start/stop switch in capturing 630, and a display section 640, and the display section 640 corresponds to the display unit.

(Fifth Application Example)

FIGS. 20A to 20G illustrate an appearance of a mobile phone. In the mobile phone, for example, an upper package 710 and a lower package 720 are joined by a joint section (hinge section) 730. The mobile phone includes a display 740, a sub-display 750, a picture light 760, and a camera 770. Among them, the display 740 or the sub-display 750 corresponds to the display unit.

Hereinbefore, although the present invention has been described with the embodiments, the modification, and the application examples, the present invention is not limited to the embodiments and the like, and various modifications may be made. For example, in the embodiments and the like, although the description has been made with the example of the case where the oxide semiconductor having n-type conductivity is used as the channel layer, the oxide semiconductor having p-type conductivity may be used as the channel layer. In this case, on the source/drain electrodes side of the p-type oxide semiconductor layer, the n-type oxide semiconductor layer exhibiting a reverse polarity of that of the p-type oxide semiconductor layer is provided, thereby forming the pn junction. This suppresses the carrier (hole) from accumulating in the p-type oxide semiconductor layer, and it is possible to reduce the carrier density. Therefore, it is possible to obtain the same effects as the case where the channel layer is the n-type.

In the application examples, although the example of the organic EL display has been given as the application example of the thin film transistor of the present invention to the display unit, it is not limited to this, and the thin film transistor of the present invention is also applicable to other types of display units (for example, a liquid crystal display unit using a liquid crystal element as a display element).

Further, the material, the thickness, the film-forming method, the film-forming conditions and the like of each layer are not limited to those described in the embodiments and the like, but other material, other thickness, other film-forming method, and other film-forming conditions may be adopted.

The present application contains subject matter related to that disclosed in Japanese Priority Patent Application JP 2010-014339 filed in the Japan Patent Office on Jan. 26, 2010, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A thin film transistor comprising:
   a gate electrode;
   a pair of source/drain electrodes;
   a first oxide semiconductor layer provided between the gate electrode, and the pair of source/drain electrodes, and forming a channel; and
   a second oxide semiconductor layer on a side of the first oxide semiconductor layer and in a region facing a separation groove between the pair of source/drain electrodes, the second oxide semiconductor layer having a polarity different from that of the first oxide semiconductor layer.

2. The thin film transistor according to claim 1, wherein the polarity of the first oxide semiconductor layer is an n-type, and the polarity of the second oxide semiconductor is a p-type.

3. The thin film transistor according to claim 1, comprising: the gate electrode; the first oxide semiconductor layer; the second oxide semiconductor layer; and the pair of source/drain electrodes in this order on a substrate.

4. The thin film transistor according to claim 1, wherein
   a metal layer is provided continuously with the second oxide semiconductor layer in an in-plane direction between the second oxide semiconductor layer and the pair of source/drain electrodes, and
   the second oxide semiconductor layer is made of a metal oxide constituting the metal layer.

5. The thin film transistor according to claim 1, further comprising a protective film on the second oxide semiconductor layer, wherein
   the pair of source/drain electrodes are provided from above the first oxide semiconductor layer to the protective film.

6. The thin film transistor according to claim 1, wherein the second oxide semiconductor layer in the region facing the separation groove is buried in a part on the pair of source/drain electrodes side of the first oxide semiconductor layer.

* * * * *